(12) United States Patent
Furukawa (10) Patent No.: US 6,287,024 B1
(45) Date of Patent: Sep. 11, 2001

(54) HEATING UNIT

(75) Inventor: Koji Furukawa, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/378,727

(22) Filed: Aug. 23, 1999

(30) Foreign Application Priority Data

Aug. 28, 1998 (JP) .................................................. 10-243603

(51) Int. Cl.$^7$ ................................................... G03B 3/08
(52) U.S. Cl. .................... 396/571; 396/611; 396/616; 219/216
(58) Field of Search ...................... 396/571, 573, 396/575, 577, 602, 611, 612, 616; 355/27; 430/302, 330; 219/216

(56) References Cited

U.S. PATENT DOCUMENTS

| 3,684,372 | * | 8/1972 | Limberger | 355/27 |
| 4,334,755 | * | 6/1982 | Harrell et al. | 396/571 |
| 4,573,782 | * | 3/1986 | Kobayashi et al. | 396/571 |
| 4,697,919 | * | 10/1987 | Hertel | 355/27 |
| 5,313,248 | * | 5/1994 | Mita et al. | 355/27 |
| 5,634,166 | * | 5/1997 | Furukawa | 396/571 |
| 5,980,128 | * | 11/1999 | Verlinden et al. | 396/575 |

FOREIGN PATENT DOCUMENTS

| 41 34 161 C2 | 12/1996 | (DE) . |
| 0 484 557 A1 | 5/1992 | (EP) . |

* cited by examiner

Primary Examiner—Alan A. Mathews
(74) Attorney, Agent, or Firm—Sughrue, Mion, Zinn, Macpeak & Seas, PLLC (57) ABSTRACT

Temperature control of heaters 8a and 8b for heating a printing original plate 2 is performed with an atmosphere temperature sensor 11, etc., and stably generated heat is shielded by controlling the rotation angles of reflecting plates 9a and 9b. The leading end of the printing original plate 2 is detected by a position detection sensor 26 and the transport speed of the printing original plate 2 is controlled. As the trailing end of the printing original plate 2 is detected, the rotation angles of the reflecting plates 9a and 9b are controlled and the heating amount is controlled in response to the parts of the printing original plate 2. Accordingly, it is possibly to heat the whole printing original plate while preventing uneven heating, when the printing original plate is heated and transported.

7 Claims, 6 Drawing Sheets

HEATING UNIT

BACKGROUND OF THE INVENTION

This invention relates to a heating unit for heating a photosensitive planographic printing original plate comprising a photosensitive layer placed on a metal support while transporting the plate after exposure and in particular to a heating unit applicable as a unit for heat developing of a printing original plate.

A method of executing image exposure of a photosensitive material containing silver halide, a reducing agent, and a polymerizable compound and developing the silver halide, thereby polymerizing the polymerizable compound like an image and forming a polymer image is described in Japanese Patent Examined Publication No. Hei. 3-12307 and Japanese Patent Examined Publication No. Hei. 3-12308 (U.S. Pat. No. 4,629,676 and EP No. 0174634).

In this method, polymerization is started by oxidant radical of the reducing agent reducing the silver halide (the radical may be a radical produced by decomposition of the oxidant of the reducing agent; it will be hereinafter referred to simply as oxidant radical). That is, the photosensitive material is heated, the silver halide is developed, and a cure image of the polymerizable compound is formed as execution of heat developing.

The described image formation method can also be applied to manufacturing of a printing plate.

Photosensitive materials preferred for manufacturing a printing plate are described in Japanese Patent Unexamined Publication No. Sho. 64-17047 (U.S. Pat. No. 4,985,339 and EP. No. 0298522), Japanese Patent Unexamined Publication No. Hei. 5-249667 (U.S. Pat. No. 5,122,443 and EP No. 0426192), Japanese Patent Unexamined Publication No. Hei. 4-191856 (U.S. Pat. No. 5,290,659), Japanese Patent Unexamined Publication No. Hei. 5-142775, Japanese Patent Unexamined Publication No. Hei. 6-27652, and Japanese Patent Unexamined Publication No. Hei. 5-107764. The photosensitive materials described in these publications are characterized by the fact that cure reaction using silver halide as an optical sensor is used; at least three layers of a curable layer containing a polymerizable compound or a cross-linkable polymer, a photosensitive layer containing silver halide, and an overcoat layer containing a base precursor are deposited in order on a support and a reducing agent is contained in any layer (the photosensitive material will be hereinafer referred to as silver trigger polymerization type photosensitive material). In the printing plate manufacturing method, the polymerizable compound or cross-linkable polymer is cured by the above-mentioned heat developing, then an eluate is used to remove uncured portions and the remaining cure image is used as a printing plate image.

The printing plate uses a metal plate (generally, an aluminum plate) as a support.

To thus form an image on a printing original plate comprising the silver trigger polymerization type photosensitive material placed on a metal support, a heat treatment unit is required.

Such heat treatment is roughly classified into a non-contact heating method of applying a heat ray from a heater to a printing original plate and a contact heating method wherein a printing original plate comes in contact with a heater, as described in Japanese Patent Unexamined Publication No. Hei. 4-240643.

Figure 8:
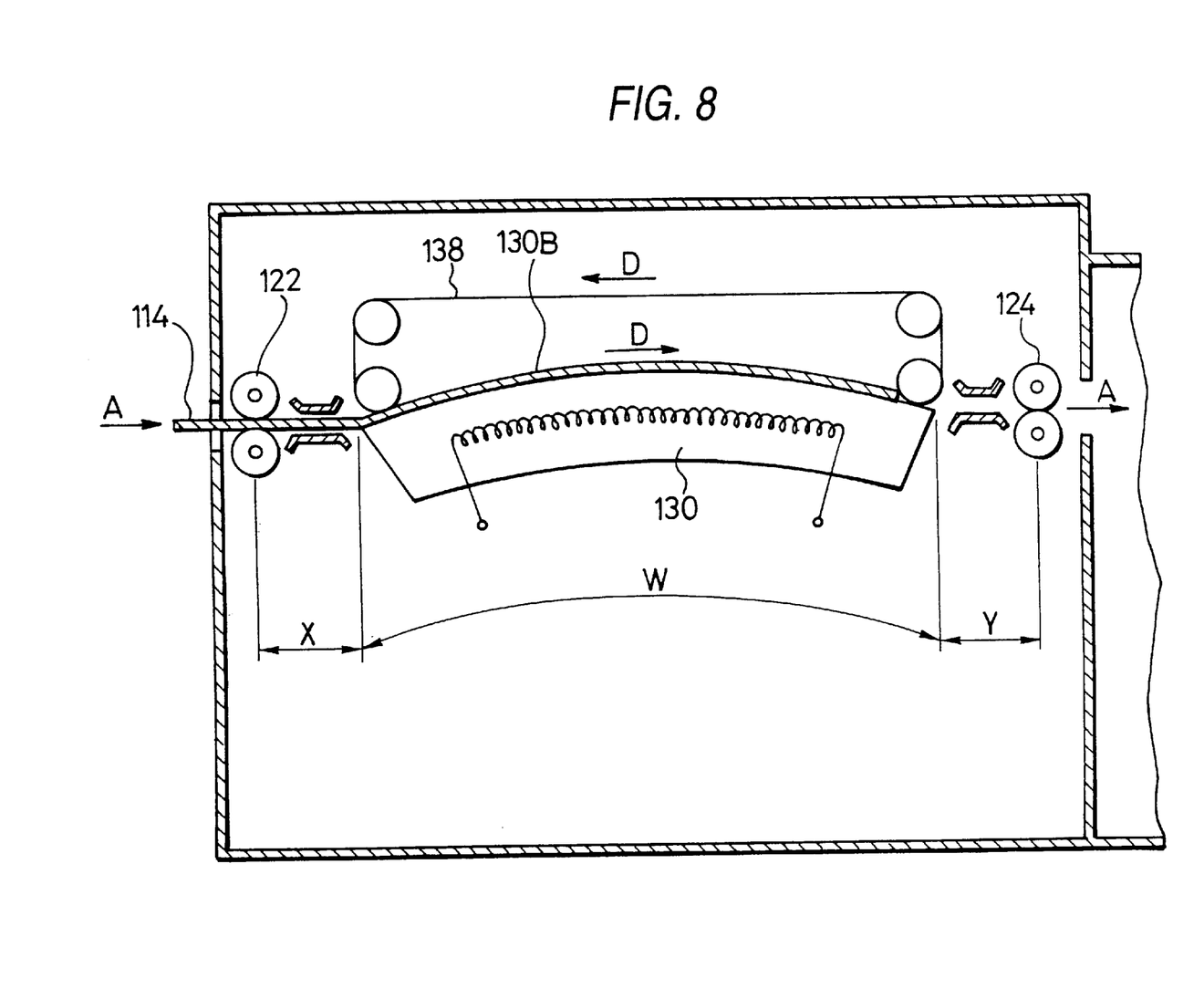
FIG. 8 is a schematic sectional view to show an example of a heating unit adopting a contact method in related art.

A heating unit adopting the contact heating method is adapted to sandwich a printing original plate 114 between an endless belt 138 and a heating plate 130 and as the endless belt. 138 moves, to transport the printing original plate 114 while bringing the printing original plate 114 into sliding contact with the heating plate 130 and heat the printing original plate 114 by heat of the heating plate 130, for example, as shown in FIG. 8. The surface of the heating plate 130 is bent like a circular arc and the printing original plate 114 is made sufficiently thin to curve along the bend. The endless belt 138 is given tension for pressing the printing original plate 114 against the heating plate 130. Transport rollers 122 and 124 are disposed ahead and behind the heating plate 130 in the transport direction for transporting the printing original plate 114 into nip between the heating plate 130 and the endless belt 138 and transporting the printing original plate 114 out of the nip as indicated by arrows A.

The printing original plate 114 transported into the nip between the heating plate 130 and the endless belt 138 by means of the transport rollers 122 and 124 is transported while it is brought into sliding contact with the heating plate 130 as the endless belt 138 is turned as indicated by arrow D, and is heated by heat of the heating plate 130. At this time, the endless belt 138 is given tension by a bend part 130B of the heating plate surface, whereby the printing original plate 114 is pressed against the heating plate side by the endless belt 138, comes in intimate contact with the heating plate, and is heated entirely. Temperature ranging from about 70° C. to 200° C. is used as the heating temperature of the silver trigger polymerization type photosensitive material.

By the way, since the printing original plate 114 has the support made of a metal plate, thermal expansion occurs upon heating. Since the printing original plate 114 is pressed against the heating plate 130 by the endless belt 138 and comes in intimate contact with the heating plate 130, a shift at either end is limited and extension caused by the thermal expansion goes from the end margin to the inside. Normally, the printing plate becomes deformed so as to protrude at the center roughly over the full length. Since the printing original plate 114 is warped due to the thermal expansion, the contact between the printing original plate 114 and the heating plate 130 becomes uneven and the heat developing efficiency is degraded in the incomplete contact part. Resultantly, the polymerization cure image in this part suffers a loss or the cure degree is degraded and the image strength lowers; if the printing original plate 114 is used as a printing plate, printing resistance is degraded partially. For example, if an attempt is made to form such minute dots with the number of halftone lines of 200 and the halftone dot area percentage of 2%, the heat developing efficiency in the incomplete contact part is degraded and insufficient cure occurs. Thus, minute halftone dots are formed in small size as compared with those formed in the complete contact part and tone differs partially; uniformity of the printing original plate 114 for use as a printing plate is not satisfied.

Figure 9:
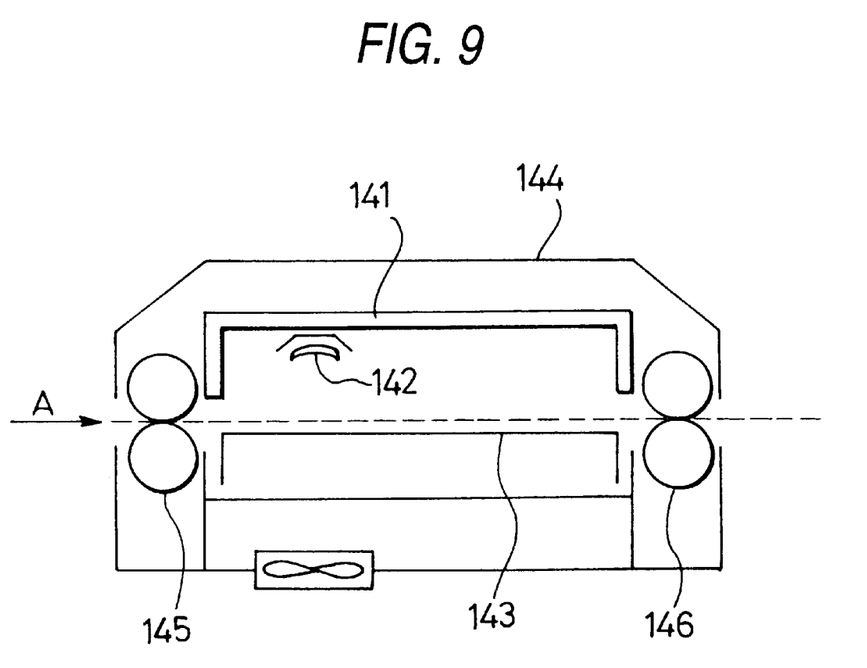
FIG. 9 is a schematic sectional view to show an example of a heating unit adopting a non-contact method in related art.

On the other hand, a heating unit having a structure as shown in FIG. 9 is available with the above-mentioned non-contact heating method. This heating unit comprises a heater 142 and a guide plate 143 for guiding a printing original plate in a heat insulation case 141, the surroundings of which 141 are covered with a case 144. This case 144 contains transport-in rollers 145 for transporting a print original plate inserted from the arrow A direction into the heating unit and transport-out rollers 146.

In the heating unit, the print original plate inserted from the arrow A direction runs below the heater 142 at constant speed and is heated, then is sandwiched between the transport-out rollers 146 and is transported to the next step.

For heating of the heater 142, the temperatures of parts of the heater are controlled based on the temperature detected by a temperature sensor provided in the heater 142.

The problem involved in the contact heating method, namely, a heating failure caused by deformation such that a printing original plate protrudes at the center roughly over the full length does not occur in the non-contact heating method.

Figure 10:
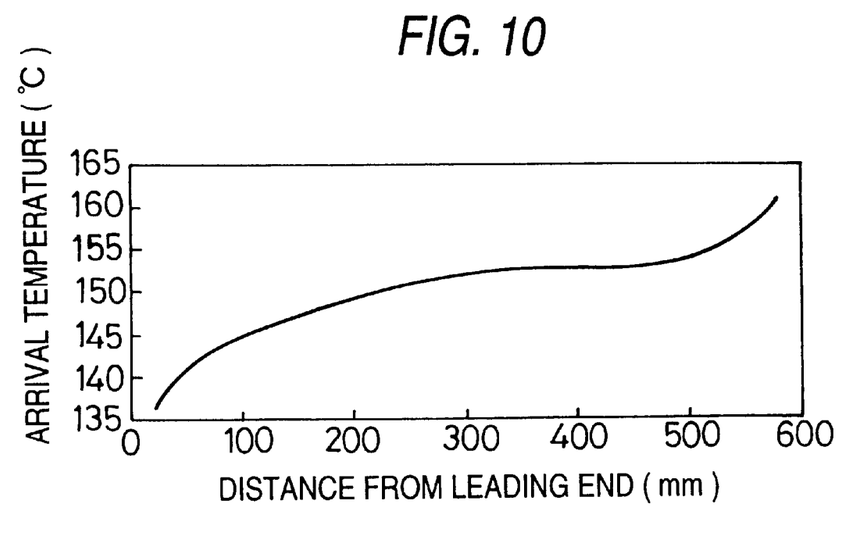
FIG. 10 is a temperature characteristic chart to show uneven heating of a printing original plate.

However, in the non-contact heating method, the leading and trailing end arrival temperatures vary as shown in FIG. 1C in response to the parts of a printing original plate as the result of measuring the temperature of the printing original plate, because a temperature gradient occurs between a heated portion and an unheated portion and energy moves, whereby the temperature of the leading end portion lowers and that of the trailing end portion rises. Therefore, the printing original plate is not heated uniformly.

Further, the time stability of the temperature in the heat insulation case 141, in other words, the atmospheric temperature in the heating part is not good, causing uneven heating.

SUMMARY OF THE INVENTION

It is therefore an object of the invention to provide a heating unit for controlling the amount of heat given to a printing original plate in response to the parts of the printing original plate from the move direction for rendering the heating temperature of the printing original plate uniform.

The object of the invention can be accomplished by a heating unit for heating a printing original plate comprising a photosensitive layer placed on a metal support by transporting the printing original plate in a thermal atmosphere radiated from a heat source, the heating unit according to a first aspect of the present invention comprising:

a movable heat shield member being disposed between the printing original plate and the heat source for varying the heat shield amount in response to the move distance of the heat shield member.

In addition, the object of the invention can also be achieved by a heating unit for heating a printing original plate comprising a photosensitive layer placed on a metal support by transporting the printing original plate in a thermal atmosphere radiated from a heat source, the heating unit according to a second aspect of the present invention comprising:

a movable heat shield member being disposed between the printing original plate and the heat source and detection means for detecting the leading end and the trailing end of the printing original plate, wherein as the leading end of the printing original plate is detected, the transport speed between the leading end being detected and the leading end portion passing through below the heat source is controlled for controlling the heating amount of the leading end portion and as the trailing end of the printing original plate is detected, the heat shield member is driven for controlling the heating amount of the trailing end portion of the printing original plate.

Further, the object of the invention can be attained by a heating unit for heating a printing original plate comprising a photosensitive layer placed on a metal support by transporting the printing original plate in a thermal atmosphere radiated from a heat source, the heating unit according to a third aspect of the present invention comprising:

detection means for detecting the leading end and the trailing end of the printing original plate, wherein as the leading end of the printing original plate is detected, the transport speed between the leading end being detected and the leading end portion passing through below the heat source is controlled for controlling the heating amount of the leading end portion and as the trailing end of the printing original plate is detected, the power amount for driving the heat source is controlled for controlling the heating amount of the trailing end portion of the printing original plate.

In the above-mentioned heating unit according to the first to third aspect of the present invention, it is preferable to further includes a member for detecting atmosphere temperature in the heating unit, transport-in roller temperature, temperature in a room wherein the heating unit is installed, and printing original plate temperature before heating, wherein the temperature of the heat source is controlled based on the detected temperatures.

In the above-mentioned heating unit, it is advantageous that a heating section exit is hermetically sealed with a flexible member which comes in contact with the front and rear surfaces of the printing original plate and becomes deformed into a wave-shape in accordance with the contact with the printing original plate.

As the heat shield member, a reflecting plate on the rear side of the heat source can be formed rotatably in a vertical plane and be moved between the heat source and the printing original plate for shielding heat.

A heat shield plate disposed movably between the heat source and the printing original plate can be used as the heat shield member.

The transport speed of the printing original plate is controlled to low speed when the leading end portion of the printing original plate passes through below the heat source; in other parts, the transport speed is controlled to high speed.

As described above, in the heating unit adopting the non-contact heating method, the heat shield member is moved to a proper position for shielding heat generated from the heat source whenever necessary, whereby accurate heat treatment can be executed in response to the parts of the printing original plate for uniformly heating the printing original plate.

The transport speed of the printing original plate is controlled in response to the parts of the printing original plate, whereby the amount of heat given to the printing original plate can be controlled for uniformly heating the printing original plate.

The heating treatment targeted by the invention includes treatment of generating an acid by image exposure and curing a film by heating, treatment of developing a silver latent image formed by image exposure by heating and curing with generated radical, treatment of promoting reaction started by image exposure by heating, and the like.

The photosensitive material to which the invention is applied is not limited if it is a photosensitive material developed by heating or a photosensitive material requiring heating treatment before wet developing. The silver trigger polymerization type photosensitive materials described in a Japanese Patent Unexamined Publication No. Sho. 64-17047 (U.S. Pat. No. 4,985,339 and EP No. 0298522), a Japanese Patent Unexamined Publication No. Hei. 5-249667 (U.S. Pat. No. 5,122,443 and EP No. 0426192), a Japanese Patent Unexamined Publication No. Hei. 4-191856 (U.S. Pat. No. 5,290,659), a Japanese Patent Unexamined Publication No. Hei. 5-142775, a Japanese Patent Unexamined Publication No. Hei. 6-27652, and a Japanese Patent Unexamined Publication No. Hei. 5-107764 can also be used as preferred photosensitive materials.

A Japanese Patent Unexamined Publication No. Hei. 7-20625 and a Japanese Patent Unexamined Publication No. Hei. 11-218903 describe negative image recording material containing (A) to (D):

(A) Compound decomposed by light or heat and generating an acid (B) Crosslinking agent for cross-liking by an acid (C) At least one type of alkali soluble resin (D) Infrared absorption agent.

A planographic printing plate material using such a negative image recording material as mentioned above undergoes image exposure by a solid laser or a semiconductor laser for radiating infrared rays having wavelength 760 nm to 1200 nm. Developing may be performed just after laser application; preferably, heating treatment is executed between the laser application and developing steps and it is desirable to heat for 10 seconds to five minutes in the range of 80° C. to 150° C. The invention is also effective for the heating treatment. The material is heated as required, then is developed in an alkaline water solution, whereby uncured portions are removed and the remaining cured image is used as the printing plate image.

DETAILED DESCRIPTION OF THE PREFERRED EMBODIMENTS

Referring now to the accompanying drawings, there are shown embodiments of the invention with the invention applied to a silver trigger polymerization type photosensitive material.

Figure 1:
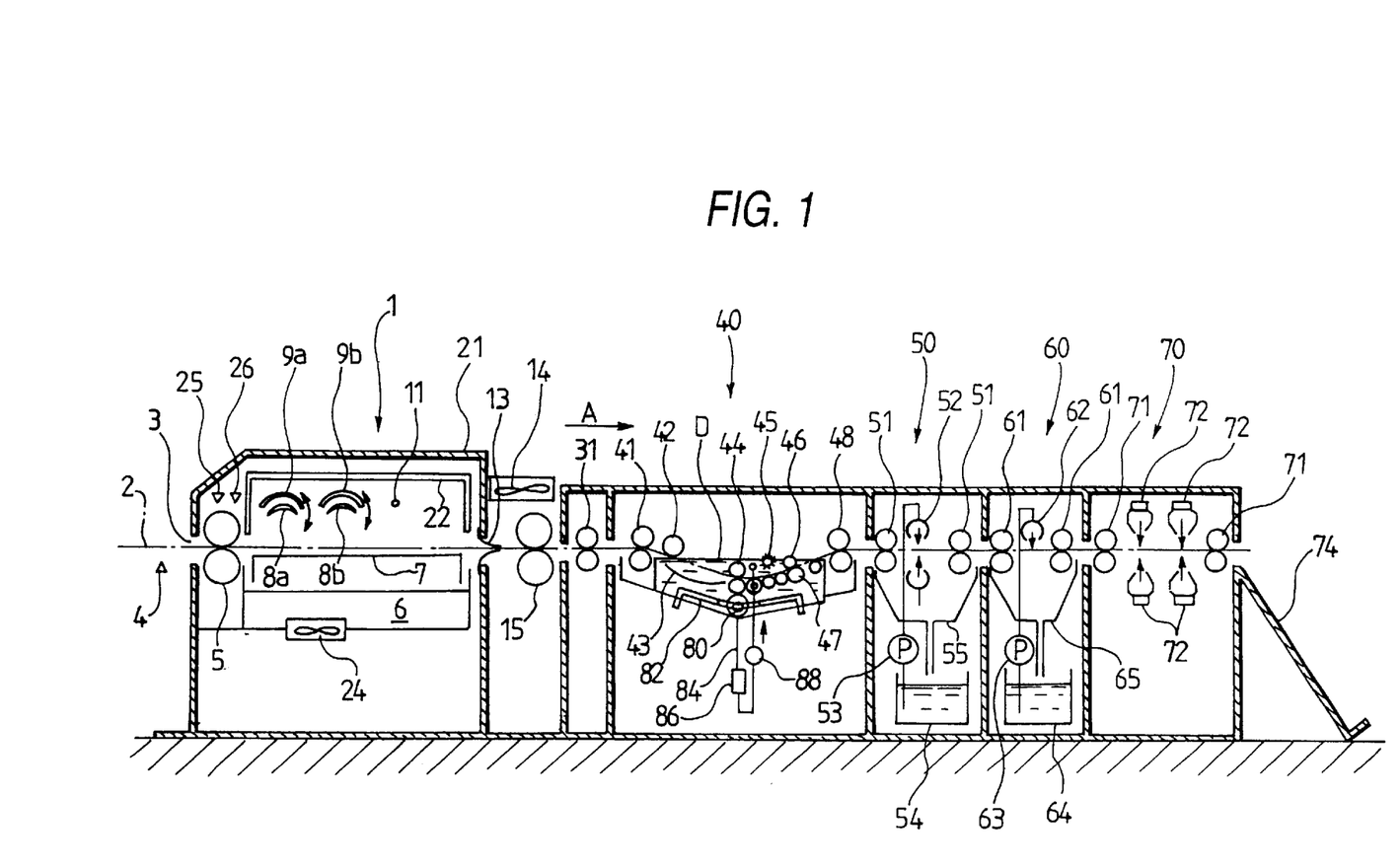
FIG. 1 is a schematic sectional view to show a plate making apparatus incorporating a heating unit of the invention.

FIG. 1 is a schematic sectional view to show a plate making apparatus incorporating a heating unit 1 of the invention.

A printing original plate 2 comprises an image formation layer placed on a support. The support is a thin plate made of metal, typically, aluminum or an aluminum alloy.

In heating, if an attempt is made to insert the printing original plate 2 into a transport entrance 3 of the heating unit 1, a transport-in sensor 4 detects the attempt and drives the heating unit 1. The printing original plate 2 is sandwiched between transport-in rollers 5 and is transported into a heating section 6, then is transported on a guide wire 7 downstream as indicated by arrow A. A position detection sensor 26 for detecting the leading end and trailing end of the printing original plate 2 is placed in the proximity of the transport rollers.

Two heaters 8a and 8b are disposed above the guide wire 7 for heating the printing original plate 2 transported on the guide wire 7 by radiation heat. Rotatable reflecting plates 9a and 9b are disposed above the heaters 8a and 8b. The heat amount given to the printing original plate 2 can be controlled by rotating the reflecting plates 9a and 9b. Heating control with the reflecting plates 9a and 9b will be described later in detail with reference to FIGS. 2 and 3.

The heated printing original plate 2 passes through nip between a pair of exit blades 13 placed at a transport exit 12 and is transported downstream, then is cooled by a cooling fan 14, is sandwiched between transport rollers 15, and is transported through cooling rollers 31 to an elution section 40 at the following stage.

In the elution section 40, the printing original plate 2 is guided into a liquid developer (for example, liquid developer DP-4 for PS plate manufactured by Fuji Photo film Co. Ltd.) by means of entrance transport rollers 41 and a guide roller 42. After this, the printing original plate 2 proceeds in the liquid developer along a guide plate 43, is sandwiched between transport rollers 44, and is guided so that a developing side comes in contact with a brush roller 45 for forward rotating with respect to the transport direction (in other words, a developing side comes in contact with a brush roller 45 while said brush roller 45 rotates in a counterclockwise direction in FIG. 1). Further, the printing original plate 2 is guided into the top of the liquid developer by means of guide rollers 46 and 47, is sandwiched between squeeze rollers 48, and is transported to a washing section 50.

The elution section 40 is provided with a heater 80 and a cooling water distribution pipe 82, and a liquid developer is heated or cooled to adjust the temperature of the liquid developer to a proper temperature. The elution section 40 is replenished with a replenishment liquid by a replenishment pump whenever necessary and an excessive liquid overflows and is discharged. Water to supplement evaporated water is added by a water replenishment pump. Further, the elution section 40 comprises a circulation system made up of piping 84, a filter 86 for removing contamination of liquid developer D, and a pump 88.

In the washing section 50, the printing original plate 2 is transported by means of transport rollers 51 and wash water is sprayed on the printing original plate 2 through spray nozzles 52.

Two pairs of transport rollers 51 are placed up and down with the printing original plate 2 between, upstream and downstream in the move direction A with the spray nozzles 52 between, and are rotated with the printing original plate 2 sandwiched between the transport rollers 51, thereby transporting the printing original plate 2 in the transport direction A. The spray nozzles 52 are placed facing each other on both sides of the printing original plate 2 for spraying wash water pumped up from a water reception tank 54 by a circulation pump 53 on both sides of the printing original plate 2. The sprayed wash water drops from the printing original plate 2, then is collected in the water reception tank 54 by means of a saucer 55.

In a gum liquid application section 60, the printing original plate 2 is transported by means of transport rollers 61 and a gum liquid is sprayed on the printing original plate 2 through a spray nozzle 62.

Two pairs of transport rollers 61 are placed up and down with the printing original plate 2 between, upstream and downstream in the move direction A with the spray nozzle 62 between, and are rotated with the printing original plate 2 sandwiched between the transport rollers 61, thereby transporting the printing original plate 2 in the transport direction A. The spray nozzle 62 is placed facing the image formation layer of the printing original plate 2 for spraying a gum liquid pumped up from a gum liquid tank 64 by a circulation pump 63 (for example, gum liquid GU-7 for PS plate manufactured by Fuji Photo Film Co., Ltd.) on the image formation layer of the printing original plate 2. The sprayed gum liquid drops from the printing original plate 2, then is collected in the gum liquid tank 64 by means of a saucer 65.

In a drying section 70, the printing original plate 2 is transported by means of transport rollers 71 and is dried by driers 72.

Two pairs of transport rollers 71 are placed up and down with the printing original plate 2 between, upstream and downstream in the move direction A with the driers 72 between, and are rotated with the printing original plate 2 sandwiched between the transport rollers 71, thereby transporting the printing original plate 2 in the move direction A. Two pairs of driers 72 are placed facing both sides of the printing original plate 2 for drying the printing original plate 2 after the gum treatment by spraying warm air on both sides of the printing original plate 2.

As a treatment sequence of the printing original plate 2, first an original film is brought into intimate contact with the image formation layer of the printing original plate 2 in an exposure unit (not shown) and the printing original plate 2 is exposed for 1.5 seconds using 500-watt tungsten lamp with a band-pass filter for allowing 500-nm light to pass through, making the printing original plate exposed. Next, as shown in FIG. 1, the printing original plate 2 is transported from the heating section 1 through the elution section 40, the washing section 50, and the gum liquid application section 60 to the drying section 70 consecutively, and undergoes predetermined treatment in the sections in sequence.

That is, the heated printing original plate 2 is cooled by means of the cooling rollers 31, then undergoes elution treatment in the elution section 40 and an image formation promotion layer, a photosensitive layer, and an uncured portion of a cure layer, namely, non-image areas of the image formation layer except a cured portion of the cure layer are eluted. The printing original plate 2 is washed in the washing section 50 and the eluate on the printing original plate 2 is removed, then the printing original plate 2 undergoes gum treatment in the gum liquid application section 60 and the gum liquid deposited on the surface of the printing original plate 2 is dried in the drying section 70. The post-dried printing original plate 2 is transported to a tray 74 and is accumulated.

Figure 2:
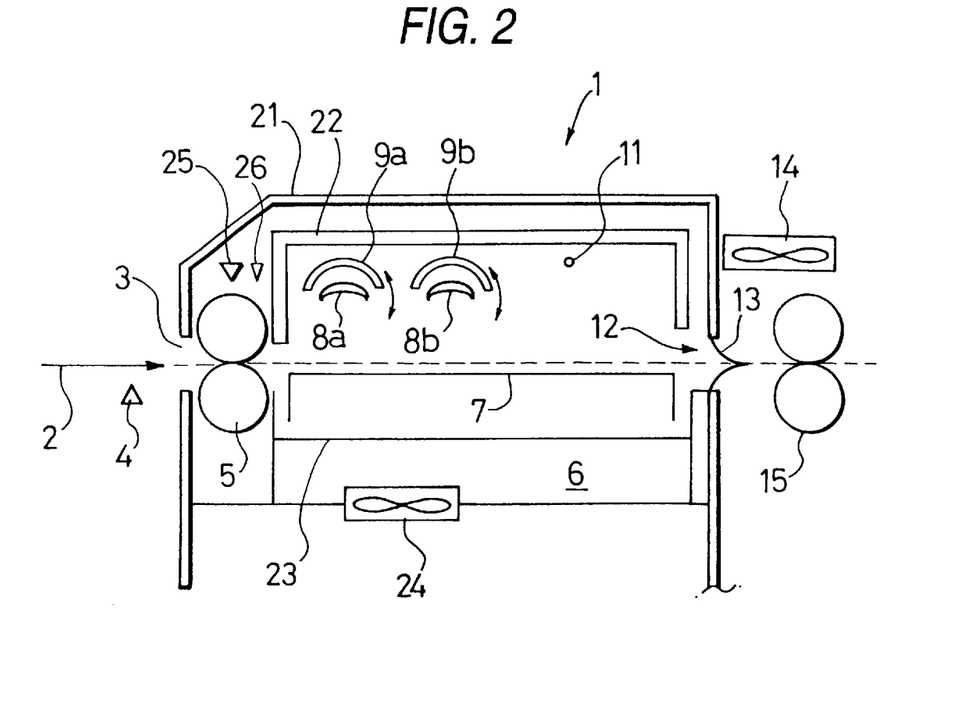
FIG. 2 is a schematic sectional view to show a first embodiment of the heating unit of the invention.

Next, the heating unit 1 will be discussed as a first embodiment of the invention. The heating unit 1 is a unit containing steps of the transport-in sensor 4 to the heating section 6 to the transport rollers 15 in the plate making apparatus shown in FIG. 1. FIG. 2 is an enlarged sectional view of the heating unit 1.

As shown here, the heating unit 1 has a structure wherein the whole heating section 6 is housed in a case 21. The whole upper part of the heating section 6 is covered with a heat insulation cover 22 and the lower side of the guide wire 7 is covered with a shield plate 23; the shield plate 23 is formed in a part with an exhaust port and the heating section 6 is formed on the bottom with a heat exhaust fan 24.

The two heaters 8a and 8b are disposed at positions at predetermined height relative to the guide wire 7 upstream in the heating section 6 (left of FIG. 2) and the reflecting plates 9a and 9b, each of which is semicircular in transverse cross section, are placed rotatably above the heaters 8a and 8b. The heaters 8a and 8b correspond to heat sources mentioned in the invention; preferably, far infrared ceramic heaters are used.

The reflecting plates 9a and 9b are provided for adjusting the heat amount given to the printing original plate 2. If the positions of the reflecting plates 9a and 9b are controlled above the heaters 8a and 8b as shown in FIG. 2, radiation heat of the heaters 8a and 8b is not shielded and moreover is reflected, thus the printing original plate 2 is heated in the maximum heat amount. The positions of the reflecting plates 9a and 9b are controlled from the sides of the heaters 8a and 8b to the sides below the heaters 8a and 8b, whereby the shield amount of the radiation heat increases and the heat amount given to the printing original plate 2 is controlled low.

An atmosphere temperature sensor 11 detects temperature in the heating section 6 and a roller temperature detection sensor 25 detects temperature of the transport rollers 5. Temperature control in the heating section 6 is performed by using the sensors 11 and 25 and the heat exhaust fan 24.

That is, letting proper setup temperature of the heater 8a, 8b be Q, $$Q = A \cdot (T - T_o) + B \cdot ((T + T_o)/2 - T_1) \tag{1}$$

where A and B are constants, T is heating temperature, To is transport-in roller temperature, and T1 is atmosphere temperature in the heating section. The temperature To is detected by the transport-in roller temperature detection sensor 25 and the temperature $T_1$ is detected by the atmosphere temperature sensor 11.

Further, if the atmosphere temperature in the heating section 6 reaches the heating temperature T of the proper atmosphere temperature or more, the heat exhaust fan 24 is driver for lowering the temperature so that the proper atmosphere temperature T is always maintained.

Maintaining of the proper setup temperature Q and the proper atmosphere temperature T and control of the heat amount given to the printing original plate 2 by the reflecting plates 9a and 9b are performed comprehensively by a controller (not shown) and the printing original plate 2 is transported at constant speed.

Figure 3:
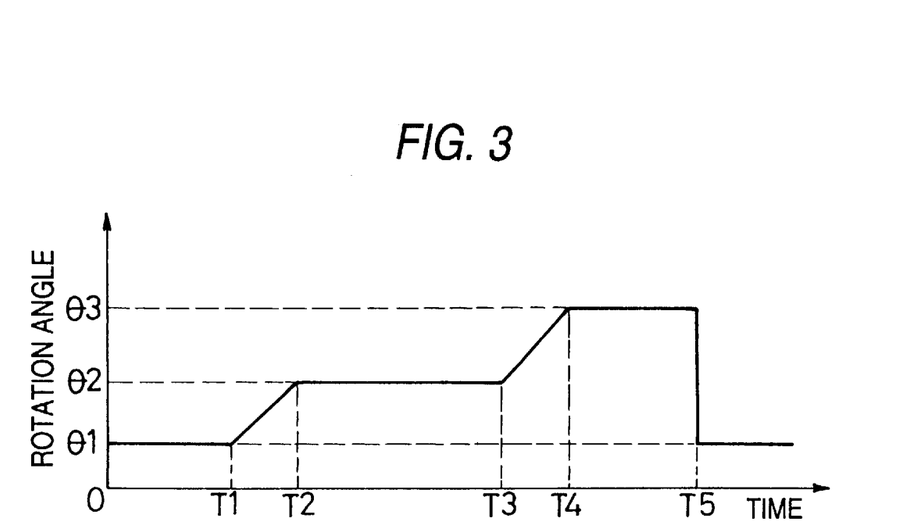
FIG. 3 is a characteristic chart to show the relationship between reflecting plate rotation angle and time.

To heat the printing original plate 2, when the printing original plate 2 is inserted into the transport entrance 3, it is detected by the transport-in sensor 4, then as the transport rollers 5 are rotated, the printing original plate 2 is transported and is detected by the position detection sensor 26 and with this detection as a trigger, the rotation angle of the reflecting plate 9a, 9b is controlled as shown in FIG. 3.

The reflecting plate 9a, 9b is positioned at a predetermined angle, for example, above the heater 8a, 8b as shown in FIG. 2 from the insertion detection time 0 to T1 time. The position at this time corresponds to θ1, which normally is 0 degrees relative to the horizontal direction. Next, the rotation angle is controlled from θ1 to θ2 between T1 and T2, and the rotation angle θ2 is maintained until T3. Next, the rotation angle is controlled from θ2 to θ3 between T3 and T4, the rotation angle θ3 is maintained between T4 and T5, and when T5 time is reached, the rotation angle is restored to the rotation angle θ1.

Assume that the reflecting plate 9a, 9b is positioned above the heater 8a, 8b at the angle θ1 and is positioned below the heater 8a, 8b in stages at the angles θ2 and θ3. The part below the heater 8a, 8b becomes the maximum heating amount between 0 and T1, then the heating amount lowers in two stages and again is restored to the maximum heating amount. On the other hand, the printing original plate 2 is transported below the heaters 8a and 8b at constant speed, thus first the leading end portion is heated in the maximum heating amount, next the center portion is heated in a slightly low heating amount, and the trailing end portion is heated in a furthermore low heating amount.

The printing original plate 2 thus heated passes through nip between a pair of exit blades 13 from the transport exit 12 and is transported to the outside of the heating section 6. The printing original plate 2 is cooled to about 100° C., for example, by the cooling fan 14, is sandwiched between the transport rollers 15, and is transported to the following step as previously described with reference to FIG. 1.

The exit blades 13, which are made of flexible material and come in contact with the surface and rear of the printing original plate 2, can improve hermeticity of the heating section 1 and eliminate uneven heating. If the exit blade 13 is provided only on the surface of the printing original plate 2, when the printing original plate 2 thermally expands, becomes deformed, and waves upon heating, outside air enters the heating section 1 from the rear face of the portion which becomes upward convex and cools the printing original plate 2 partially, causing uneven heating to occur. However, uneven heating of the printing original plate 2 can be prevented by providing a pair of flexible exit blades 13.

As described above, in the embodiment, the radiation heat of the heaters 8a and 8b is not controlled and in addition to control of radiation heat constant as described above, the reflecting plates 9a and 9b are rotated and heat is shielded, thereby controlling the heating amount of the printing original plate 2.

Therefore, heating and heat shielding are performed with no time lag and extremely accurate heating can be executed in response to the parts of the printing original plate 2.

Next, a second embodiment of the invention will be discussed with reference to FIGS. 4 and 5. The second embodiment differs from the first embodiment in that a heat shield plate is adopted as a separate member without using reflecting plates as heat shield members; members identical with or similar to those previously described with reference to FIG. 2 are denoted by the same reference numerals in FIG. 4.

A heat shield plate 16 can be moved in a lateral direction to positions below heaters 8a and 8b from the position indicated by the solid line in FIG. 4. In this case, when the heat shield plate 16 is placed at the position indicated by the solid line, a print original plate 2 is heated directly by radiation heat of the heaters 8a and 8b; when the heat shield plate 16 is placed at a position below the heaters 8a and 8b, heat is shielded in response to the position, so that the heating amount is controlled.

To heat the printing original plate 2, when the printing original plate 2 is inserted into a transport entrance 3, it is detected by a transport-in sensor 4 and transport is started, then the printing original plate 2 is transported and is detected by a position detection sensor 26 and with this detection as a trigger, the position of the heat shield plate 16 is controlled from the position shown in FIG. 4 to the position below the heaters 8a and 8b.

Figure 4:
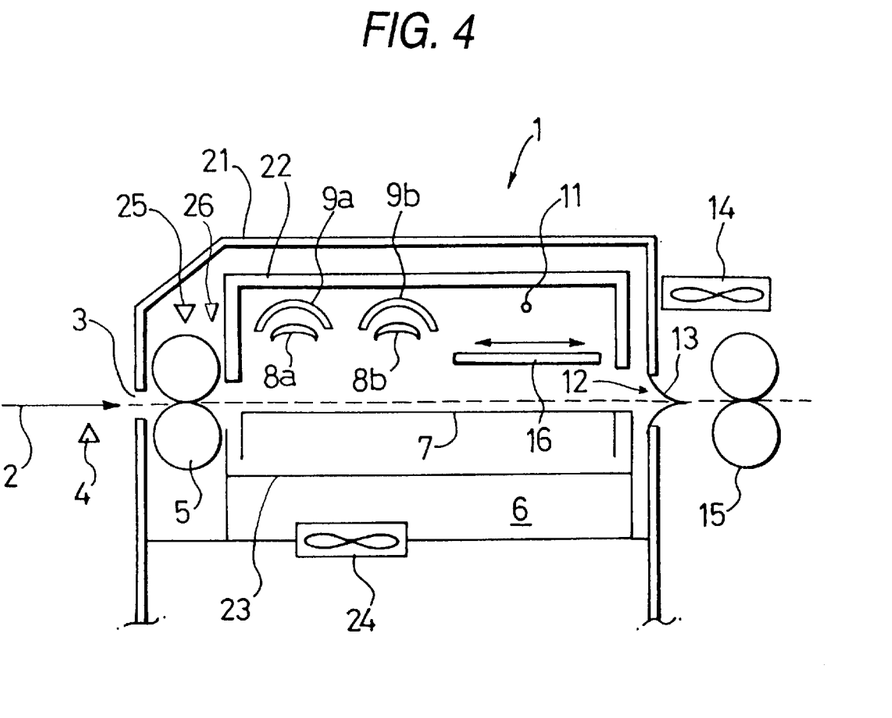
FIG. 4 is a schematic sectional view to show a second embodiment of a heating unit.
Figure 5:
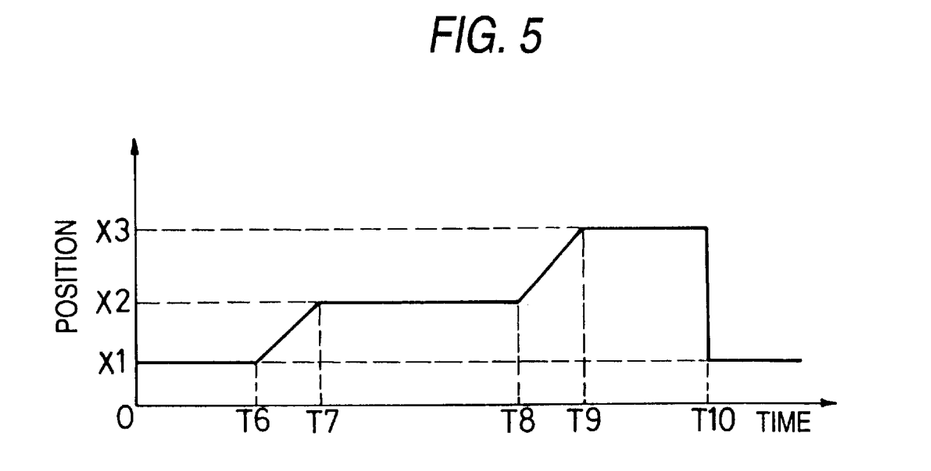
FIG. 5 is a characteristic chart to show the relationship between heat shield plate move position and time.

The heat shield plate 16 is controlled to a predetermined position, for example, a position out of the position below the heaters 8a and 8b as shown in FIG. 4 from the insertion detection time 0 to T6 time. Next, the position is controlled from X1 to X2 between T6 and T7, and the position X2 is maintained until T8. Next, the position is controlled from X2 to X3 between T8 and T9, the position X3 is maintained between T9 and T10, and when T10 time is reached, the position is restored to the position X1, namely, the former position.

Assume that the heat shield plate 16 is positioned outside the heaters 8a and 8b at the position X1 and is positioned below the heaters 8a and 8b in stages at the positions X2 and X3. The parts below the heaters 8a and 8b become the maximum heating amount between 0 and T6, then the heating amount lowers in two stages and again is restored to the maximum heating amount. On the other hand, the printing original plate 2 is transported below the heaters 8a and 8b at constant speed, thus first the leading end portion is heated in the maximum heating amount, next the center portion is heated in a slightly low heating amount, and the trailing end portion is heated in a furthermore low heating amount.

The printing original plate 2 thus heated passes through nip between exit blades 13 from a transport exit 12 and is transported to the outside of the heating section 6. The printing original plate 2 is cooled to about 100° C., for example, by a cooling fan 14, is sandwiched between transport rollers 15, and is transported to the following step as previously described with reference to FIG. 1.

As described above, in the embodiment, the radiation heat of the heaters 8a and 8b is not controlled and in addition to control of radiation heat constant as described above, the position of the heat shield plate 16 moved for shielding heat, thereby controlling the heating amount of the printing original plate 2.

Therefore, heating and heat shielding are performed with no time lag and extremely accurate heating can be executed in response to the parts of the printing original plate 2.

Next, a third embodiment of the invention will be discussed with reference to FIG. 6. In the embodiment, heating temperature is controlled while speed of a printing original plate 2 is controlled. The control can be applied to any of the heating units 1 previously described in the first and second embodiments, but a drive motor of a transport-in roller 5 and a drive motor of a transport-out roller 15 are separate and the rollers are controlled separately.

Figure 6:
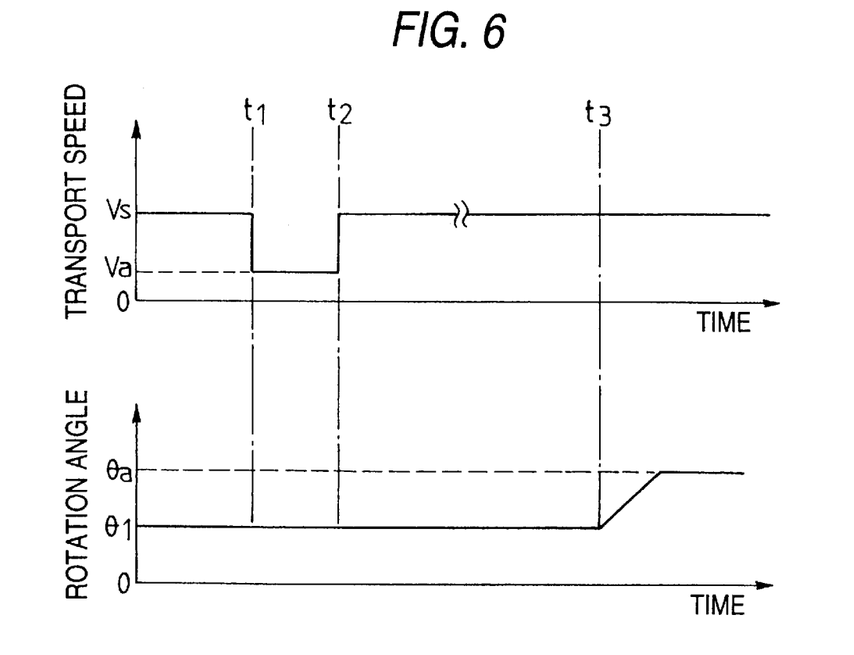
FIG. 6 is a characteristic chart of speed and heat control to show a third embodiment of the invention.

At the heating time, if the leading end of the printing original plate 2 is detected by a position detection sensor 26, the transport speed of the transport-in roller 5 is switched from stationary speed Vs to low speed Va as shown at t1 time in FIG. 6. If the control is applied to the heating unit 1 shown in FIG. 2, the printing original plate 2 is transported below the heaters 8a and 8b at the low speed Va. However, the reflecting plates 9a and 9b are placed in the state shown in FIG. 2, namely, at the θ1 positions previously described with reference to FIG. 3 and heat generated from the heaters 8a and 8b is applied to the printing original plate 2 without being shielded.

If the control is applied to the heating unit 1 shown in FIG. 4, the heat shield plate 16 is placed at the X1 positions previously described with reference to FIG. 5 and heat generated from the heaters 8a and 8b is applied to the printing original plate 2 without being shielded.

The printing original plate 2 is transported at the low speed Va and the transport distance of the printing original plate 2 can be previously known. The transport speed is controlled from the low speed Va to the stationary speed Vs at time t2 at which the preset portion of the printing original plate 2 from the leading end thereof passes through below the heater 8a, 8b. Therefore, the leading end portion of the printing original plate 2 is heated in a large heat amount while it is transported at the low speed Va.

The operation will be discussed with the heating unit 1 shown in FIG. 2. The printing original plate 2 is transported below the heaters 8a and 8b at high speed after the t2 time as compared with the speed between t1 and t2. However, the reflecting plates 9a and 9b remain at θ1 as shown in the lower part of FIG. 6, thus the heat energy of the printing original plate 2 decreases.

When the printing original plate 2 is thus transported and heated continuously, the trailing end of the printing original plate 2 is detected by the position detection sensor 26. When the trailing end is detected, the intermediate portion of the printing original plate 2 is placed below the heaters 8a and 8b and the trailing end portion is placed before the heaters 8a and 8b.

At the time t3 at which a predetermined time has elapsed since the trailing end was detected, the reflecting plates 9a and 9b are driven and set to angle θa as shown in the lower part of FIG. 6. This angle θa is not limited to the angle θ2 or θ3 and is set properly in association with the transport speed of the printing original plate 2.

If the control is applied to the heating unit 1 previously described in the second embodiment, the shield positions of the heaters 8a and 8b by the heat shield plate 16 are set. Meanwhile, the transport speed of the transport-out roller 15 is controlled constant to the stationary speed Vs.

Control of the transport speed of the printing original plate 2 and heating control with the reflecting plates 9a and 9b are thus performed in combination, whereby the heating time of the leading end portion of the printing original plate 2 by the heaters 8a and 8b is prolonged. The transport speed is controlled to the stationary speed Vs in the intermediate portion of the printing original plate 2, and a part of heat of the heaters 8a and 8b is shielded in the trailing end portion, thereby rendering the heat energy uniform.

Therefore, also in the third embodiment, heating and heat shielding are performed with no time lag and extremely accurate heating can be executed in response to the parts of the printing original plate 2.

Next, a fourth embodiment of the invention will be discussed with reference to FIG. 7. In the above-described embodiments, supply power for heating the heaters 8a and 8b is made constant for maintaining a constant heating value and the heating temperature of the printing original plate 2 is controlled with the reflecting plates 9a and 9b and the heat shield plate 16. However, as in the fourth embodiment described below, the supply power amount for heating heaters 8a and 8b can also be controlled in response to the transport position of a printing original plate 2, thereby controlling the heating value of the heater 8a, 8b.

Figure 7:
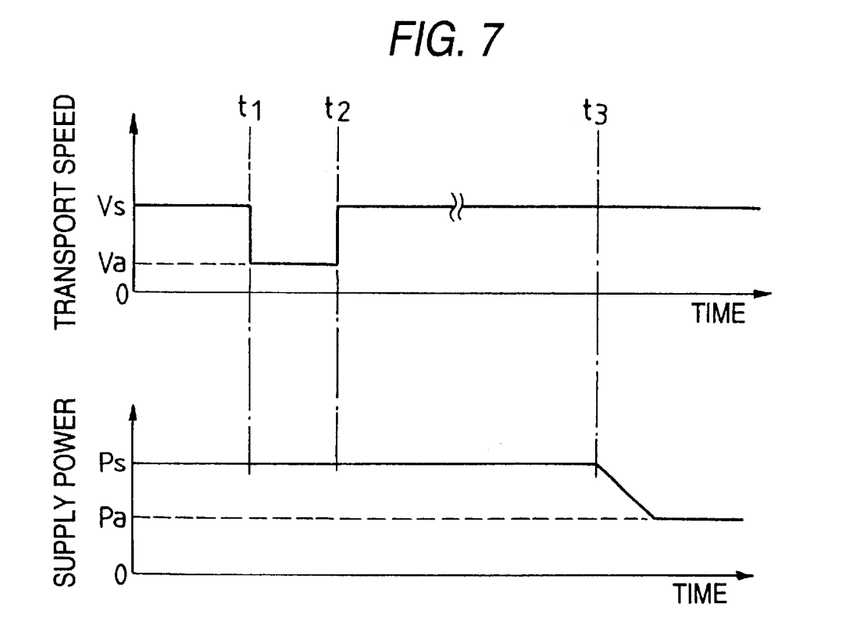
FIG. 7 is a characteristic chart of speed and heat control to show a fourth embodiment of the invention.

At the heating time, if the leading end of the printing original plate 2 is detected by a position detection sensor 26, the transport speed of a transport-in roller 5 is switched from stationary speed Vs to low speed Va as shown at t1 time in FIG. 7. If the control is applied to the heating unit 1 shown in FIG. 2, the printing original plate 2 is transported below the heaters 8a and 8b at the low speed Va. However, the reflecting plates 9a and 9b are placed in the state shown in FIG. 2, namely, at the θ1 positions previously described with reference to FIG. 3 and heat generated from the heaters 8a and 8b is applied to the printing original plate 2 without being shielded.

If the control is applied to the heating unit 1 shown in FIG. 4, the heat shield plate 16 is placed at the X1 positions previously described with reference to FIG. 5 and heat generated from the heaters 8a and 8b is applied to the printing original plate 2 without being shielded.

The printing original plate 2 is transported at the low speed Va and the transport distance of the printing original plate 2 can be previously known. The transport speed is controlled from the low speed Va to the stationary speed Vs at time t2 at which the preset portion of the printing original plate 2 from the leading end thereof passes through below the heater 8a, 8b. Therefore, the leading end portion of the printing original plate 2 is heated in a large heat amount while it is transported at the low speed Va.

The operation will be discussed with the heating unit 1 shown in FIG. 2. The printing original plate 2 is transported below the heaters 8a and 8b at high speed after the t2 time as compared with the speed between t1 and t2. However, the reflecting plates 9a and 9b remain at θ1, thus the heat energy of the printing original plate 2 decreases.

When the printing original plate 2 is thus transported and heated continuously, the trailing end of the printing original plate 2 is detected by the position detection sensor 26. When the trailing end is detected, the intermediate portion of the printing original plate 2 is placed below the heaters 8a and 8b and the trailing end portion is placed before the heaters 8a and 8b.

The power amount for heating the heater 8a, 8b is controlled to stationary supply power Ps as shown in the lower part of FIG. 7 to the time t3 at which a predetermined time has elapsed since the trailing end was detected, but is lowered and controlled to low power Pa from the time t3 after detection of the trailing end. Resultantly, the transport speed of the printing original plate 2 is the stationary speed Vs, but the heat energy for heating the printing original plate 2 lowers.

Control of the transport speed of the printing original plate 2 and heating control with the heaters 8a and 8b are thus performed in combination, whereby the heating time of the leading end portion of the printing original plate 2 by the heaters 8a and 8b is prolonged. The transport speed is controlled to the stationary speed Vs in the intermediate portion of the printing original plate 2, and heat of the heaters 8a and 8b lowers in the trailing end portion, thereby rendering the heat energy uniform.

Therefore, also in the fourth embodiment, extremely accurate heating can be executed in response to the parts of the printing original plate 2. Meanwhile, the transport speed of the transport-out roller 15 is controlled constant to the stationary speed Vs.

In the third and fourth embodiments, the transport speed of the printing original plate 2 is controlled to the stationary speed Vs at t2 and later. Therefore, the treatment process in the next step previously described with reference to FIG. 1 is not affected and a sequence of heating and developing can be performed smoothly.

The transport-in rollers 6 and the transport-out rollers 15 are controlled separately, whereby before one printing original plate 2 is transported out from the heating section 6, another printing original plate 2 can be heated successively, so that the user is free of the wait time, etc., and the ease-of-use of the whole unit is improved.

As described above, according to the invention, the heat arrival amount from the heat source is controlled by controlling the position of the heat shield plate, the heating time is controlled by controlling the transport speed of the printing original plate, the heating capability is controlled by controlling power of the heat source, or control is performed in combination, whereby the printing original plate is heated in response to the parts thereof.

Therefore, the printing original plate can be heated uniformly and uneven heating can be prevented from occurring.

The present invention is based on Japanese Patent Application No. Hei. 10-243603, which is incorporated herein by reference.

While there has been described in connection with the preferred embodiment of the invention, it will be obvious to those skilled in the art that various changes and modifications may be made therein without departing from the invention, and it is aimed, therefore, to cover in the appended claim all such changes and modifications as fall within the true spirit and scope of the invention.

What is claimed is:

1. A heating unit for heating a printing original plate comprising a photosensitive layer placed on a metal support by transporting the printing original plate in a thermal atmosphere radiated from a heat source, said heating unit comprising:

a movable heat shield member disposed between the printing original plate and the heat source for varying a heat shield amount in response to a moving distance of said heat shield member; and means for detecting atmosphere temperature in said heating unit, transport-in roller temperature, temperature in a room wherein said heating unit is installed, and printing original plate temperature before heating, wherein temperature of the heat source is controlled based on the detected temperatures.

2. A heating unit for heating a printing original plate comprising a photosensitive layer placed on a metal support by transporting the printing original plate in a thermal atmosphere radiated from a heat source, said heating unit comprising:

a movable heat shield member disposed between the printing original plate and the heat source; and detection means for detecting a leading end and a trailing end of the printing original plate, wherein when the leading end of the printing original plate is detected, transport speed between the leading end being detected and the leading end portion passing through below the heat source is controlled for controlling a heating amount of the leading end portion, and when the trailing end of the printing original plate is detected, said heat shield member is driven for controlling a heating amount of a trailing end portion of the printing original plate.

3. A heating unit for heating a printing original plate comprising a photosensitive layer placed on a metal support by transporting the printing original plate in a thermal atmosphere radiated from a heat source, said heating unit comprising:

detection means for detecting a leading end and a trailing end of the printing original plate, wherein when the leading end of the printing original plate is detected, transport speed between the leading end being detected and a leading end portion passing through below the heat source is controlled for controlling a heating amount of the leading end portion and when the trailing end of the printing original plate is detected, a power amount for driving the heat source is controlled for controlling a heating amount of a trailing end portion of the printing original plate.

4. The heating unit as claimed in claims 2 or 3 further comprising:

means for detecting atmosphere temperature in said heating unit, transport-in roller temperature, temperature in a room wherein said heating unit is installed, and printing original plate temperature before heating, wherein temperature of the heat source is controlled based on the detected temperatures.

5. The heating unit as claimed in claims 2 or 3 wherein a heating section exit is hermetically sealed with a flexible member which comes in contact with the front and rear surfaces of the printing original plate and becomes deformed into a wave-shape in accordance with the contact with the printing original plate.

6. The heating unit as claimed in claim 4, wherein a heating section exit is hermetically sealed with a flexible member which comes in contact with the front and rear surfaces of the printing original plate and becomes deformed into a wave-shape in accordance with the contact with the printing original plate.

7. A heating unit for heating a printing original plate comprising a photosensitive layer placed on a metal support by transporting the printing original plate in a thermal atmosphere radiated from a heat source, said heating unit comprising:

a movable heat shield member disposed between the printing original plate and the heat source for varying a heat shield amount in response to a moving distance of said heat shield member, wherein a heating section exit is hermetically sealed with a flexible member which comes in contact with the front and rear surfaces of the printing original plate and becomes deformed into a wave-shape in accordance with the contact with the printing original plate.

* * * * *